(12) United States Patent
Chia et al.

(10) Patent No.: US 6,225,695 B1
(45) Date of Patent: *May 1, 2001

(54) GROOVED SEMICONDUCTOR DIE FOR FLIP-CHIP HEAT SINK ATTACHMENT

(75) Inventors: Chok J. Chia, Cupertino; Seng-Sooi Lim, San Jose; Maniam Alagaratnam, Cupertino, all of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/869,796

(22) Filed: Jun. 5, 1997

(51) Int. Cl.$^7$ .............................. H01L 23/04; H01L 23/34
(52) U.S. Cl. .......................... 257/712; 257/707; 257/712; 257/706; 257/738; 257/737; 257/778; 257/713; 257/779; 257/782; 257/783
(58) Field of Search ..................... 257/712, 707, 257/710, 711, 713, 714, 717–722, 675, 686, 734, 737, 738, 706, 796, 778, 779, 782, 783

(56) References Cited

U.S. PATENT DOCUMENTS

| 5,223,747 | * | 6/1993 | Tschulena | 257/722 |
| 5,387,815 | * | 2/1995 | Nishiguchi | 257/704 |
| 5,514,906 | * | 5/1996 | Love et al. | 257/712 |
| 5,644,586 | * | 7/1997 | Kawono et al. | 257/88 |
| 5,770,478 | * | 6/1998 | Iruvanti et al. | 438/122 |

FOREIGN PATENT DOCUMENTS

| 58-21347 | * | 2/1983 | (JP) | 257/712 |

\* cited by examiner

*Primary Examiner*—Alexander O. Williams

(57) ABSTRACT

One aspect of the invention relates to a flip-chip semiconductor package. In one version of the invention, the flip-chip semiconductor package includes a package substrate having an upper surface, a lower surface and a plurality of conductive traces, the upper surface having an upper plurality of electrical contacts coupled to the conductive traces, the lower surface having a lower plurality of electrical contacts coupled to the conductive traces, the lower plurality of electrical contacts being attachable to electrical contacts on a printed circuit board; a semiconductor die having an active surface and a non-active surface, the active surface having a plurality of circuit elements and a plurality of bond pads formed thereon, the bond pads being attached to the upper plurality of electrical contacts by solder bumps, the non-active surface having a plurality of grooves formed thereon; and a heat sink attached to the non-active surface of the semiconductor die.

16 Claims, 5 Drawing Sheets

GROOVED SEMICONDUCTOR DIE FOR FLIP-CHIP HEAT SINK ATTACHMENT

TECHNICAL FIELD

This invention relates generally to semiconductor packaging technology, and more particularly, to techniques for attaching heat sinks in semiconductor packages. Still more particularly, the invention relates to the attachment of heat sinks in flip-chip semiconductor packages.

BACKGROUND OF THE INVENTION

The amount of heat generated by a semiconductor device, or chip, is related to the number of transistors on the device and the clock speeds at which they are operated. As more and more transistors are fabricated onto a single semiconductor device, the overall amount of heat generated by the device is increased. Similarly, the faster the transistors on the chip are operated, the more heat is generated by the device. Since advances in semiconductor fabrication technology continue to make possible both increased transistor density and higher clock speeds, the problem of heat generation is becoming increasingly severe, particularly in high performance devices which push the limits of fabrication technology.

As an increasing amount of heat is generated by the device, the junction temperatures of the transistors in the device increases proportionately. The failure rate of a semiconductor device is directly related to the junction temperature at which it is operated. The higher the junction temperature, the higher the failure rate.

It is generally known to provide a heat spreader or heat sink for a semiconductor device in order to transfer the generated heat away from the device itself and into the surrounding air, thus reducing the junction temperature. Heat sinks generally are located as physically close to the semiconductor device as possible in order to maximize the amount of heat transferred. Heat sinks typically are constructed from a high thermal conductivity material, such as copper, aluminum or high thermal conductivity plastic, and are designed to present a maximum amount of surface area to the ambient air in order to allow the heat generated by the semiconductor device to be removed, either by natural or forced convection.

One way that heat sinks increase the amount of surface area available for heat dissipation is to provide a plurality of parallel cooling fins which rise vertically from a horizontal surface, or base member. One conventional heat sink is shown in FIG. 1A. In this example, the heat sink 100 includes a base member 102, having a base surface 103 which is attachable to a corresponding surface of the semiconductor package. Heat sink 100 is also provided with a heat dissipating surface 105. In this case, the surface 105 includes fins 104a, 104b, 104c and 104d which provide greater surface area for convection cooling. Other designs include a plurality of cooling pins which rise from the base member. Numerous types of pins are known in the art having cross-sections of various shapes. Forced convection may be provided by a fan which passes air over a circuit board to which the packaged semiconductor is mounted, or, in some cases, a fan may be mounted directly onto the top of the heat sink fins themselves.

However, although heat sinks are effective in removing heat generated by a semiconductor die, attaching the heat sinks to the dies, or packages in a thermally efficient manner presents difficulties for semiconductor package designers. For example, FIG. 1B shows a cross-sectional view of a conventional encapsulated semiconductor package. The package 100 comprises a package substrate 102 having a plurality of solder balls 112 mounted to its lower surface. Solder balls 112 are used for providing electrical connection to a printed circuit board (not shown). A semiconductor die 106 is mounted to the upper surface of the package substrate 102 by a die attach material, such as epoxy, 114. Electrical connection between the circuit elements on the active surface of the die 106 and conductive traces on the package substrate 102 are provided by bond wires 108. An encapsulant 104 covers the die 106 and bond wires 108 in order to prevent damage to the package when it is handled and installed on the printed circuit board. This type of packaging is sometimes referred to as "glob-top" packaging due to the presence of the encapsulant 104. This type of packaging is desirable due to its low cost, however, the thermal performance of encapsulated packages are poor because the encapsulant 104 has a low thermal conductivity which prevents good heat transfer between the semiconductor die 106 and a heat sink which may be attached to the package.

One solution to the above problem is to provide a direct connection between the heat sink and the semiconductor die. This can be accomplished by the use of "flip-chip" packaging. A cross-sectional view of a conventional flip-chip package is shown in FIG. 2. In this case, the package 200 includes a package substrate 202 having a number of electrically conductive solder balls 206 formed on its lower surface to provide electrical contact between the package 200 and a printed circuit board (not shown). A semiconductor die 210 is mounted to the upper surface of the package substrate 202 by a number of solder bumps 214 which are formed on bond pads on the active surface of the semiconductor die 210. An underfill material 212 is provided to encapsulate and protect the solder bumps 214. Thus, it is noted that unlike the encapsulated package shown in FIG. 1B where the active surface of the die faces away from the package substrate, in a flip-chip package the active surface of the die is "flipped" so that it faces the upper surface of the package substrate.

The non-active surface of the semiconductor die 210 is now available to provide a direct connection between the die 210 and a heat sink. In the example shown in FIG. 2, the non-active surface of the semiconductor die 210 is attached to a heat sink 204 by an epoxy adhesive 208. This arrangement allows greater heat transfer between the semiconductor die 210 and the heat spreader 204, thus providing the package with improved thermal performance.

However, although thermal performance is improved, the flip-chip package illustrated in FIG. 2 suffers from several disadvantages. For example, the mechanical strength of the bond is a factor of the size of the die, the type of adhesive used, the thickness of the adhesive, and the surface finishes of the die and heat sink. These factors serve to limit the efficiency of the heat conduction between the die and the heat sink. Moreover, when the die is attached to the package substrate in the flip-chip configuration, the differences in thermal expansion of the silicon and heat sink material results in mechanical stresses on the die. For a large die, this can cause fracturing when the package is temperature cycled during use.

As semiconductor processing technology advances, the die size tends to shrink but at the same time the power dissipation of the die increases. Thus, the attachment of the heat sink to the die becomes increasingly important to device performance. Accordingly, it is an object of the invention to overcome the above mentioned problems. It is a further object of the invention to provide improved techniques for attaching a semiconductor device to a heat sink in a flip-chip configuration. Still further objects and advantages of the present invention will become apparent in view of the following disclosure.

SUMMARY OF THE INVENTION

One aspect of the invention relates to a semiconductor die useful in flip-chip packaging. In one embodiment, the semiconductor die comprises an active surface having a plurality of circuit elements and bond pads formed thereon, and a non-active surface attachable to a heat sink, the non-active surface having a plurality of grooves formed thereon.

Another aspect of the invention relates to a flip-chip semiconductor package. In one embodiment, the flip-chip semiconductor package comprises a package substrate having an upper surface, a lower surface and a plurality of conductive traces, the upper surface having an upper plurality of electrical contacts coupled to the conductive traces, the lower surface having a lower plurality of electrical contacts coupled to the conductive traces, the lower plurality of electrical contacts being attachable to electrical contacts on a printed circuit board; a semiconductor die having an active surface and a non-active surface, the active surface having a plurality of circuit elements and a plurality of bond pads formed thereon, the bond pads being attached to the upper plurality of electrical contacts by solder bumps, the non-active surface having a plurality of grooves formed thereon; and a heat sink attached to the non-active surface of the semiconductor die.

Still another aspect of the invention relates to a method for attaching a semiconductor die to a heat sink in a flip-chip package in which the semiconductor die has an active surface with a plurality of circuit elements and bond pads formed thereon and a non-active surface. In one embodiment, the method comprises the step of providing a semiconductor die with a plurality of grooves on a non-active surface; attaching the non-active surface to a surface of the heat sink; and attaching bond pads on an active surface of the semiconductor die to electrical contacts on a package substrate with solder bumps such that the active surface faces the package substrate.

DETAILED DESCRIPTION OF EMBODIMENTS OF THE INVENTION

Figure 3:
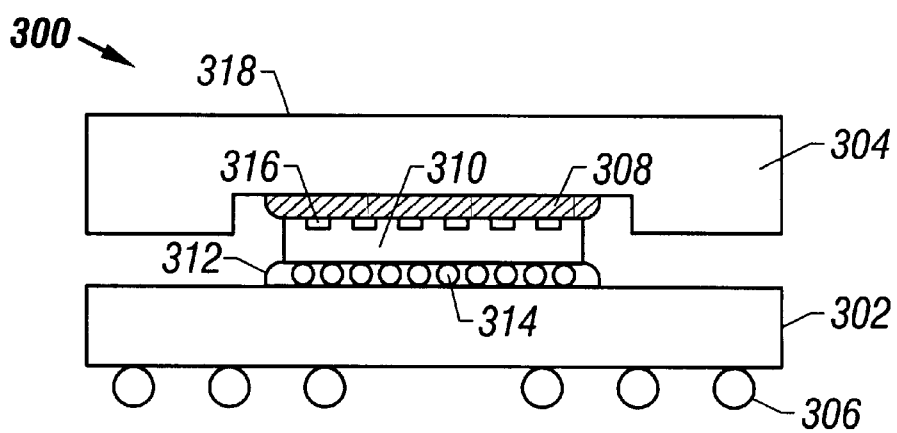
FIG. 3 is a cross-sectional view of a flip-chip package according to an embodiment of the invention.

Referring now to FIG. 3 there is shown a flip-chip semiconductor package according to an embodiment of the invention. In this case, the invention provides a package substrate 302 having a number of solder balls 306 attached to its lower surface, i.e., the surface facing the printed circuit board when the package is mounted. A semiconductor die 310 is mounted to the upper surface of package substrate 302. Bond pads formed on the active surface of semiconductor die 310 are electrically connected to electrical contacts on the upper surface of the package substrate 302 by solder bumps 314 which are encapsulated by underfill 312 as conventional in the art. The non-active side of semiconductor die 310 is coupled to a heat sink 304 by adhesive 308.

Figure 1A:
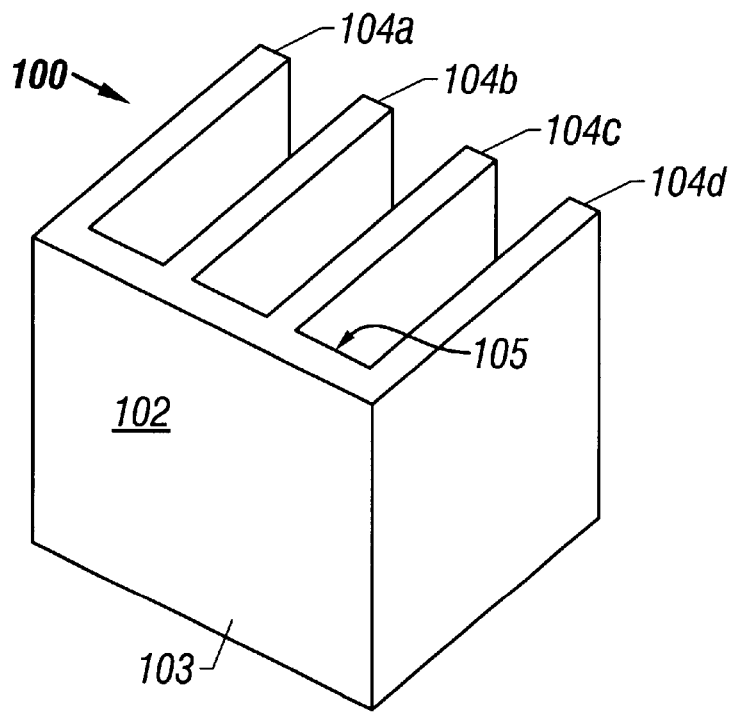
FIG. 1A is a perspective view of a conventional heat sink.
Figure 1B:
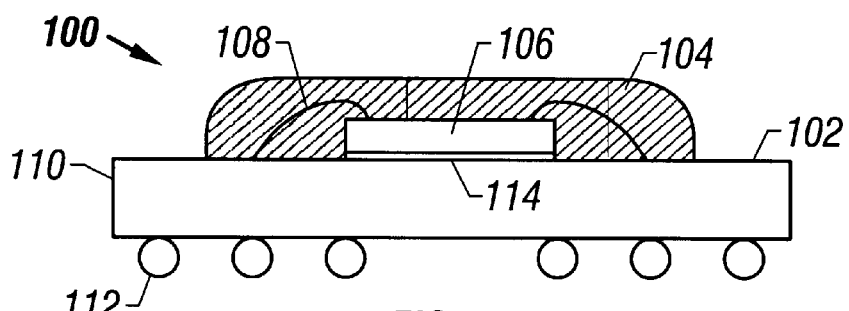
FIG. 1B is a cross-sectional view of a conventional encapsulated semiconductor package.
Figure 2:
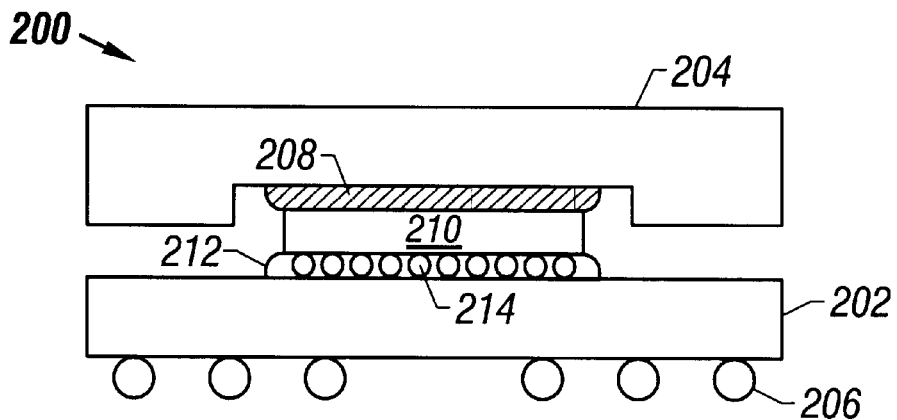
FIG. 2 is a cross-sectional view of a conventional flip-chip semiconductor package.

In this version of the invention, heat sink 304 is provided with a flat upper surface 318 for convectively removing the heat generated by semiconductor die 310. This type of configuration is sometimes referred to as a heat spreader. In other variations of the invention, heat sink 304 is provided with conducting fins, such as those shown in FIG. 1A, or thermally conducting pins. In still other variations, heat sink 304 comprises a number of heat convecting parallel plates. Various other heat sink configurations are known in the art and, although sometimes referred to in different terms, it will be understood that the term heat sink as used herein refers broadly to any thermally conductive member attached to the non-active side of the semiconductor die which dissipates the heat generated by the semiconductor die.

In the embodiment shown in FIG. 3, semiconductor die 310 is provided with a number of grooves 316 formed in the non-active surface. The grooves 316 increase the surface area of contact on the back of the die 310 for the adhesive. Since the thermal resistance of a heat transfer path is inversely proportional to the cross-sectional area of the material in the heat transfer path, it will be clear to those of skill in the art that the increase in surface area due to grooves 316 provides a corresponding increase in the thermal conductivity of the heat transfer path between semiconductor die 310 and heat sink 304. Moreover, in addition to improving the thermal transfer from the semiconductor die 310 to the heat sink 304, grooves 316 also provide an increase in the mechanical bond strength of the die 310 to the heat sink 304.

Grooves 316 also increase the strength and reliability of the die 310 because they allow a greater amount of "flex" in the die 310 without causing cracking. This results in improved reliability of the device when the device is cycled through various operating temperatures. This will be described in greater detail further herein.

The grooves 316 are created in the non-active side of die 310 by means known to those of skill in the art. For example, in one embodiment of the invention, grooves 316 are created by cutting, or grinding, with a wafer saw having a diamond coated blade of appropriate width. Alternately, grooves 316 may be etched into the non-active side of semiconductor die 310 using chemical mask and etch techniques commonly employed for silicon wafer processing. Such techniques are well known in the art, and will not be described in greater detail herein.

Figure 4A:
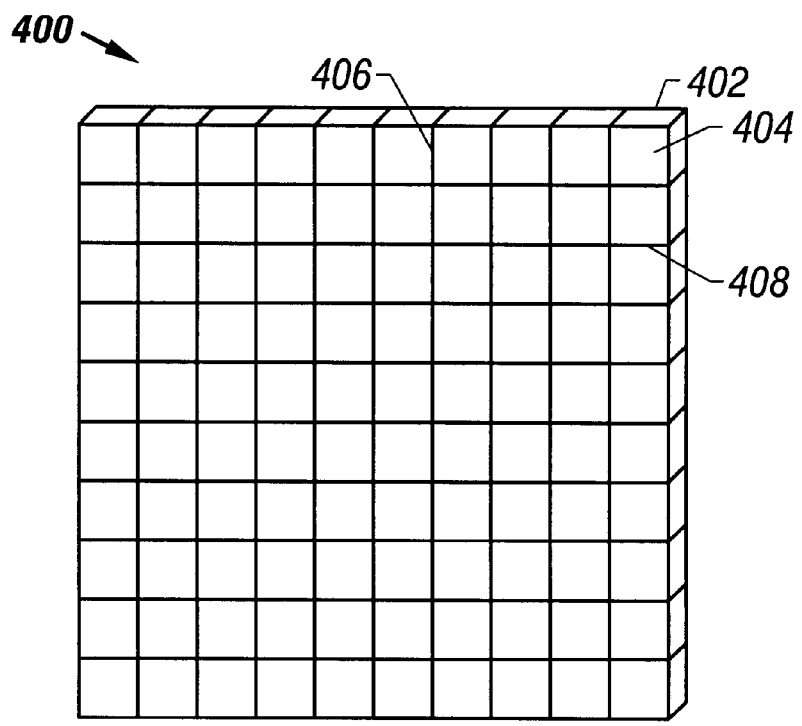
FIGS. 4A and 4B are a tip and end view, respectively, of a semiconductor die according to an embodiment of the invention.
Figure 4B:
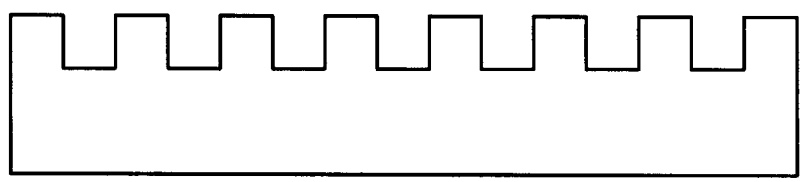

The grooves 316 can be of various sizes, shapes, or configurations depending on the requirements and efficiency of the processing. For example, FIGS. 4A and 4B show a top and end view of a semiconductor wafer 400 having grooves formed therein according to an embodiment of the invention. In this case, wafer 400 has an active side 402 which includes the various circuit elements and bond pads of the die 400. The non-active surface 404 is provided with a number of parallel grooves 406 along a first dimension, and a second number of parallel grooves 408 formed along a second dimension such that grooves 406 and 408 are orthogonal to each other, thus forming a square "crosshatch" pattern on the non-active surface 404 of the semiconductor die 400. This type of cross-hatch pattern is particularly useful when the grooves 406 and 408 are cut with a wafer saw. Of course, numerous other patterns are useful in other embodiments of the invention which also serve to create the desired additional surface area on the non-active side of the semiconductor die.

Figure 5A:
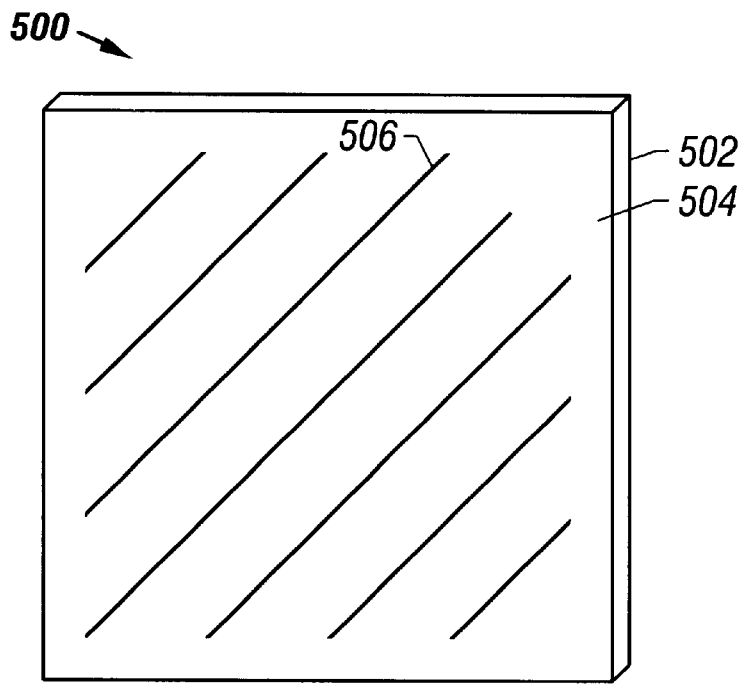
FIG. 5A is a top view of a semiconductor die according to another embodiment of the invention.

For example, FIG. 5A shows a semiconductor die 500 according to a further embodiment of the invention. In this case, the die 500 has an active surface 502 and a non-active surface 504. A plurality of parallel lines 506 are formed in the non-active surface 504 of the die 500. It is seen that the grooves 506 are disposed parallel to each other and diagonally across the non-active surface 504 of the die 500. Moreover, it is seen that grooves 506 do not run from edge to edge of the die 500, but rather, are contained within the non-active surface 504 of the die 500. Naturally, the grooves are also extendible to the edges of the die 500, or may be oriented in different directions relative to the die 500 as a matter of design choice.

Figure 5B:
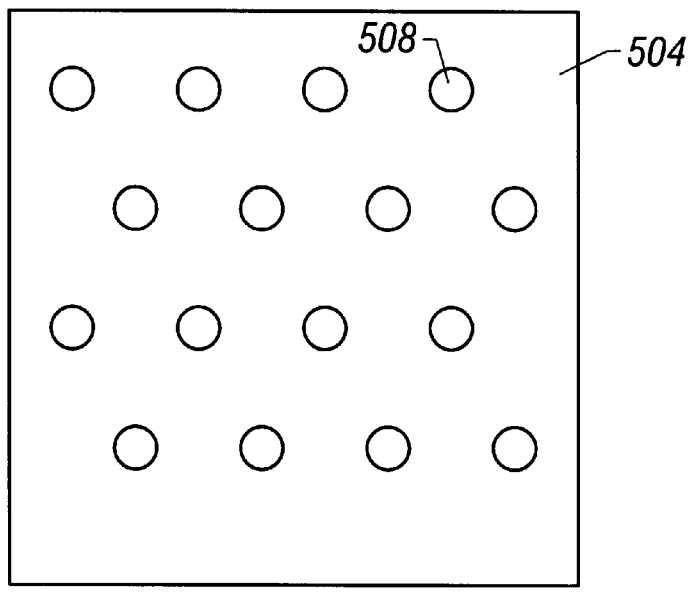
FIG. 5B is a top view of a semiconductor die according to still a further embodiment of the invention.

FIG. 5B shows still a further embodiment of the invention which the non-active surface 504 is etched with a plurality of "holes" 508 which are sufficiently large enough to allow inflow of the attachment epoxy when the semiconductor die is attached to the heat sink. Of course, holes 508 could be formed by etching processes known to those of skill in the art. Numerous other suitable grooves, shapes and configurations will occur to those of skill in the art which provide the desired increase in adhesive contact surface area on the non-active side of the semiconductor die.

Figure 6:
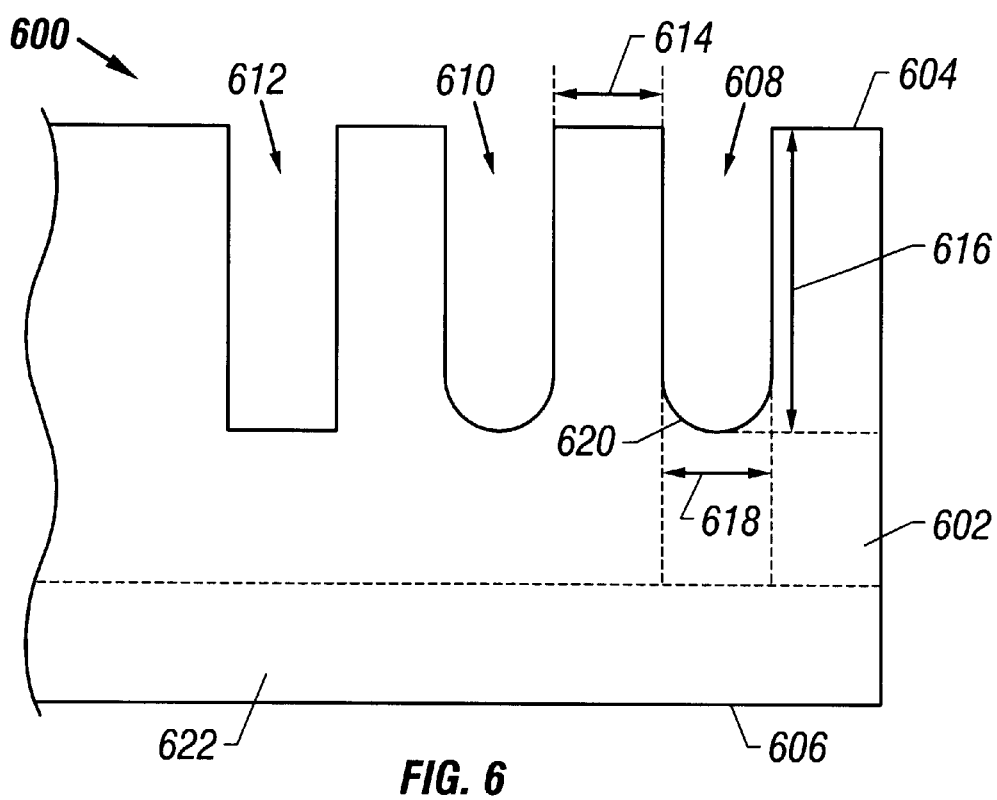
FIG. 6 is a cross-sectional view of a semiconductor die according to an embodiment of the invention.

Referring now to FIG. 6, grooves for an exemplary embodiment of the invention will be described in greater detail. FIG. 6 shows a cross-sectional view of a portion of a semiconductor die 602 having grooves 608, 610 and 612 formed therein. The die 602 has an active surface 606 and a non-active surface 604.

The active surface 606 of die 602 has the active circuit elements, such as transistors, capacitors and bond pads formed thereon. As will be understood by those of skill in the art, many of the active circuit elements formed on the active surface 606 extend into the silicon of the semiconductor device 602 for various depths which depend on the circuit elements, and the process technology. Thus, there is effectively a region 622 which extends a distance into the silicon material below the active surface 606 which can not be disturbed without risk to the circuit elements. This limits the depth to which the grooves 608, 610 and 612 may be cut into the non-active surface of the die 600 without disturbing the circuit elements.

Thus, according to one particular embodiment, it is useful to limit the depth 616 of the grooves to about one-half the thickness of the die 602. This generally ensures the die will not be damaged. Greater depths are permissible, as long as the groove 608 does not penetrate into the region 622 containing the active circuit elements. According to an even more specific embodiment of the invention, for a die 602 having a thickness of between about 13 and about 17 mils, the depth 616 of the grooves 608, 610 and 612 is between about 5 and about 8 mils.

The width 618 of the grooves is variable as a matter of design choice, but generally, since it is normally desirable to increase the surface area exposed to the adhesive, the width may be advantageously limited to about twice the depth. In one embodiment, the width of the grooves is between about 1.5 to 2 times the depth 616 of the grooves. In still another embodiment of the invention, it is advantageous that the minimum width of the grooves 608, 610 and 612 is about the same, i.e., one-to-one ratio, as the depth 616.

The number of grooves provided on the non-active side 604 of the die 602 is also a matter of design choice, but typically, the greatest practical number of grooves is preferred because each groove increases the surface area available for contact with the attachment adhesive. The number of grooves on the die is controlled by varying the distance 614 between each groove. In one advantageous embodiment, the spacing dimension 614 is about one-half of the width of the groove 608. Thus, for a 10 millimeter die, i.e, a square die having edges 10 millimeters long, with a groove width 618 of 2 millimeters, the spacing distance 614 would be 1 millimeter.

In still a further embodiment, it is useful that the bottom portion of the grooves is provided with a rounded curvature. For example, it is seen that the bottom portion of groove 608 is rounded with a curvature 620. This is advantageous over a groove having a flat bottom, for example groove 612, because the curvature 620 serves to relieve corner stress at the junction of the bottom and sides of the groove 612 which can result in fracturing of the semiconductor die 602 during the thermal stress caused by temperature cycling of the die 602 during operation, as shown with reference to groove 612. The precise radius of the curvature 620 is not critical and may be determined as a matter of design choice depending on the process used to form the grooves. For example, in one embodiment, the curvature corresponds to the radius of curvature of the diamond coated saw blade if the grooves are cut with a wafer saw. If the grooves are etched, then care must be taken to be sure that a proper curvature 620 is formed.

Although the present invention has been described with respect to particular embodiments, it will be understood by those of skill in the art that variations in form and detail are possible without departing from the spirit and scope of the present invention. All publications discussed herein are hereby incorporated by reference as though set forth in full.

What is claimed is:

1. A flip-chip semiconductor package comprising:

a package substrate having an upper surface, a lower surface and a plurality of conductive traces, the upper surface having an upper plurality of electrical contacts coupled to the conductive traces, the lower surface having a lower plurality of electrical contacts coupled to the conductive traces;

a semiconductor die having an active surface and a non-active surface, the active surface having a plurality of circuit elements and a plurality of bond pads formed thereon, the bond pads being attached to the upper plurality of electrical contacts by solder bumps, the non-active surface having a plurality of grooves formed thereon, the grooves increasing the surface area of the non-active surface of the semiconductor die;

a heat sink attached to the non-active surface of the semiconductor die with an adhesive, the adhesive filling the grooves between the heat sink and the semiconductor die, the grooves increasing the contact area of the adhesive to the semiconductor die thereby increasing the mechanical bond strength and thermal conductivity between the semiconductor die and the heat sink; and wherein at least a portion of one of the plurality of grooves is directly underneath a portion of the heat sink at a point where the portion of the heat sink is attached to the semiconductor die.

2. A semiconductor package as in claim 1 wherein the plurality of grooves are disposed in a cross-hatch pattern on the non-active surface.

3. A semiconductor package as in claim 1 wherein the plurality of grooves are disposed in parallel on the non-active surface.

4. A semiconductor package as in claim 1 wherein the plurality of grooves are formed with a depth of less than or equal to about one-half of the thickness of the semiconductor die.

5. A semiconductor package as in claim 1 wherein the plurality of grooves are formed with a width of between about one and about two times the depth of the grooves.

6. A semiconductor package as in claim 1 wherein the spacing between the plurality of grooves is between about one-half and about two times the width of the grooves.

7. A semiconductor package as in claim 1 wherein the bond pads are adhesively attached to the heat sink.

8. A method for attaching a semiconductor die to a heat sink in a flip-chip package, the semiconductor die having an active surface with a plurality of circuit elements and bond pads formed thereon and a non-active surface, the method comprising:

providing a semiconductor die with a plurality of grooves on the non-active surface, the grooves increasing the surface area of the non-active surface of the semiconductor die;

attaching the non-active surface to a surface of the heat sink with an adhesive, the adhesive filling the grooves between the heat sink and the semiconductor die, the grooves increasing the contact area of the adhesive to the semiconductor die thereby increasing the mechanical bond strength and thermal conductivity between the semiconductor die and the heat sink;

attaching the bond pads on the active surface on the semiconductor die to electrical contacts on a package substrate with solder bumps such that the active surface faces the package substrate; and wherein the step of attaching the non-active surface to a surface of the heat sink with an adhesive is performed such that at least a portion of one of the plurality of grooves is directly underneath a portion of the heat sink at a point where the portion of the heat sink is attached to the semiconductor die.

9. A method as in claim 8 wherein providing a semiconductor die with a plurality of grooves comprises providing a plurality of grooves in a cross-hatch pattern on the nonactive surface.

10. A method as in claim 8 wherein providing a semiconductor die with a plurality of grooves comprises providing a plurality of grooves in parallel on the non-active surface.

11. A method as in claim 8 wherein providing a semiconductor die with a plurality of grooves comprises providing a plurality of grooves formed with a depth of less than or equal to about one-half of the thickness of the semiconductor die.

12. A method as in claim 8 wherein providing a semiconductor die with a plurality of grooves comprises providing a plurality of grooves formed with a width of between about one and about two times the depth of the grooves.

13. A method as in claim 8 wherein providing a semiconductor die with a plurality of grooves comprises providing a plurality of grooves having a spacing of between about one-half and about two times the width of the grooves.

14. A method as in claim 8 wherein providing a semiconductor die with a plurality of grooves comprises sawing the grooves into the non-active surface.

15. A method as in claim 8 wherein providing a semiconductor die with a plurality of grooves comprises etching the grooves into the non-active surface.

16. A method as in claim 8 wherein attaching the non-active surface to a surface of the heat sink comprises disposing an adhesive between the non-active surface and the surface of the heat sink.

\* \* \* \* \*